United States Patent
Yew et al.

(10) Patent No.: US 8,624,392 B2
(45) Date of Patent: Jan. 7, 2014

(54) ELECTRICAL CONNECTION FOR CHIP SCALE PACKAGING

(75) Inventors: Ming-Chih Yew, Hsin-Chu (TW); Fu-Jen Li, Hsin-Chu (TW); Po-Yao Lin, Zhudong Township (TW); Chia-Jen Cheng, Banciao (TW); Hsiu-Mei Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 13/152,734

(22) Filed: Jun. 3, 2011

(65) Prior Publication Data

US 2012/0306070 A1    Dec. 6, 2012

(51) Int. Cl.
*H01L 23/485* (2006.01)

(52) U.S. Cl.
USPC .................................................. 257/737

(58) Field of Classification Search
USPC ............. 257/E23.021, 41, 81, 82, 91, 99, 257/177–182, 276, 457, 459, 502, 503, 573, 257/584, 602, 621, 664–677, 688–700, 257/734–786; 438/83, 98, 100, 101, 111, 438/112, 123, 124, 411, 412, 461, 584, 438/597–688
See application file for complete search history.

(56) References Cited

U.S. PATENT DOCUMENTS

| | | | |
|---|---|---|---|
| 6,268,568 B1 | 7/2001 | Kim | |
| 6,339,534 B1 | 1/2002 | Coico et al. | |
| 6,841,853 B2 | 1/2005 | Yamada | |
| 6,841,875 B2 | 1/2005 | Ohsumi | |
| 6,864,565 B1 * | 3/2005 | Hool et al. | 257/666 |
| 6,927,498 B2 | 8/2005 | Huang et al. | |
| 7,863,742 B2 * | 1/2011 | Yu et al. | 257/738 |
| 2007/0069346 A1 * | 3/2007 | Lin et al. | 257/673 |
| 2008/0308934 A1 * | 12/2008 | Alvarado et al. | 257/738 |
| 2009/0283903 A1 | 11/2009 | Park | |
| 2010/0283148 A1 | 11/2010 | Tsai et al. | |
| 2011/0074041 A1 | 3/2011 | Leung et al. | |
| 2011/0198753 A1 * | 8/2011 | Holland | 257/738 |
| 2011/0227216 A1 | 9/2011 | Tseng et al. | |
| 2012/0049343 A1 * | 3/2012 | Schulze et al. | 257/737 |
| 2012/0205813 A1 * | 8/2012 | Lin et al. | 257/773 |

FOREIGN PATENT DOCUMENTS

JP    2-170548 A    7/1990

OTHER PUBLICATIONS

Hayashi et al., Partial Translation of JP 2-170548 A, 1 page.

* cited by examiner

*Primary Examiner* — Dao H Nguyen
*Assistant Examiner* — Tram H Nguyen
(74) *Attorney, Agent, or Firm* — Slater & Matsil, L.L.P.

(57) ABSTRACT

A system and method for providing a post-passivation and underbump metallization is provided. An embodiment comprises a post-passivation layer that is larger than an overlying underbump metallization. The post-passivation layer extending beyond the underbump metallization shields the underlying layers from stresses generated from mismatches of the materials' coefficient of thermal expansion.

20 Claims, 8 Drawing Sheets

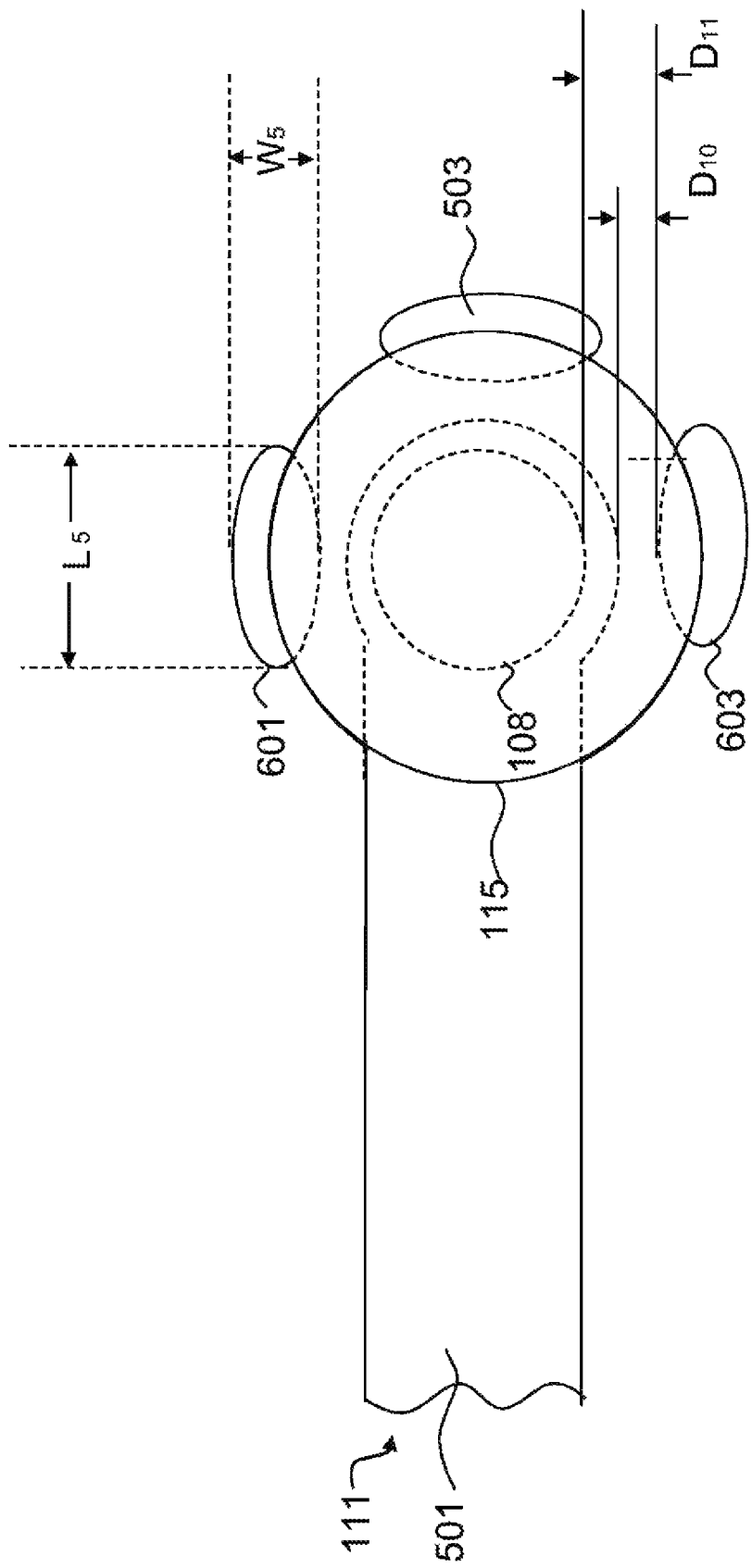

ELECTRICAL CONNECTION FOR CHIP SCALE PACKAGING

BACKGROUND

Generally, a semiconductor die may be connected to other devices external to the semiconductor die through a type of packaging utilizing solder bumps. The solder bumps may be formed by initially forming a layer of underbump metallization on the semiconductor die and then placing solder onto the underbump metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like.

However, the material that comprises the underbump metallization is merely one more type of material placed onto a stack of many different materials, such as dielectric materials, metallization materials, etch stop materials, barrier layer materials, and other materials utilized in the formation of the semiconductor die. Each one of these different materials may have a unique coefficient of thermal expansion that is different from the other materials. This type of coefficient of thermal expansion mismatch causes each one of the materials to expand a different distance when the semiconductor die is heated during later processing or use. As such, at elevated temperatures there is a coefficient of thermal expansion mismatch that causes stresses to form between the different materials and, hence, the different parts of the semiconductor die. This mismatch is especially prevalent between the underbump metallization and underlying metallization layers. If not controlled, these stresses can cause delamination to occur between the various layers of material, especially when the materials used include copper and a low-k dielectric layer. This delamination can damage or even destroy the semiconductor die during the manufacturing process or else during its intended use.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 6A-6C illustrate top-down views of discontinuous post-passivation interconnects and underbump metallizations in accordance with embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the embodiments provide many applicable inventive concepts that can be embodied in a wide variety of specific contexts. The embodiments discussed are merely illustrative of specific ways to make and use the embodiments, and do not limit the scope of the embodiments.

The embodiments will be described with respect to embodiments in a specific context, namely a post-passivation interconnect underlying an underbump metallization. The embodiments may also be applied, however, to other metallization layers.

Figure 1:
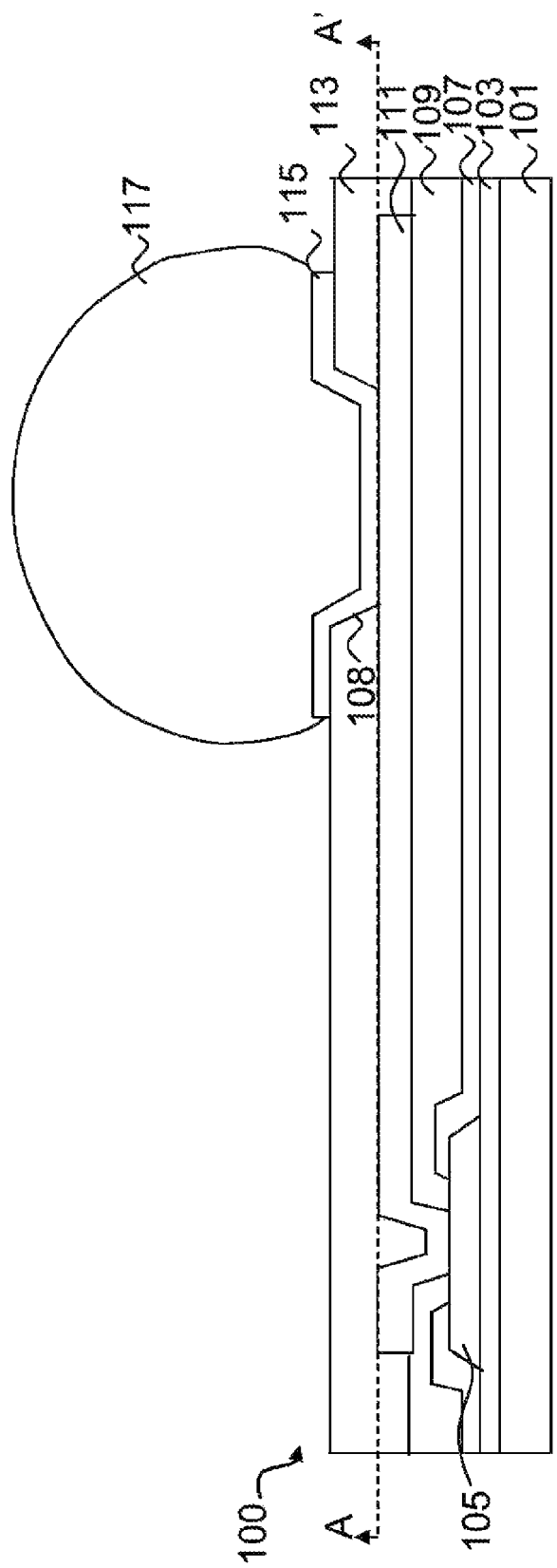
FIG. 1 illustrates a cross-sectional view of a post-passivation interconnect and underbump metallization in accordance with an embodiment.

With reference now to FIG. 1, there is shown a portion of a semiconductor die 100 including a semiconductor substrate 101 with metallization layers 103, a contact pad 105, a first passivation layer 107, a second passivation layer 109, a post-passivation interconnect (PPI) 111, a third passivation layer 113, an underbump metallization (UBM) 115, and a contact bump 117. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices (not shown) may be formed on the semiconductor substrate 101. As one of ordinary skill in the art will recognize, a wide variety of active devices such as capacitors, resistors, inductors and the like may be used to generate the desired structural and functional requirements of the design for the semiconductor die 100. The active devices may be formed using any suitable methods either within or else on the surface of the semiconductor substrate 101.

The metallization layers 103 are formed over the semiconductor substrate 101 and the active devices and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor die 100

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 μm and about 4 μm, such as about 1.45 μm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 μm and about 5 μm, such as about 9.25 KÅ.

After the first passivation layer 107 has been formed, an opening may be made through the first passivation layer 107 by removing portions of the first passivation layer 107 to expose at least a portion of the underlying contact pad 105. The opening allows for contact between the contact pad 105 and the PPI 111 (discussed further below). The opening may be formed using a suitable photolithographic mask and etching process, although any suitable process to expose portions of the contact pad 105 may be used.

The second passivation layer 109 may be formed over the contact pad 105 and the first passivation layer 107. The second passivation layer 109 may be formed from a polymer such as polyimide. Alternatively, the second passivation layer 109 may be formed of a material similar to the material used as the first passivation layer 107, such as silicon oxides, silicon nitrides, low-k dielectrics, extremely low-k dielectrics, combinations of these, and the like. The second passivation layer 109 may be formed to have a thickness between about 2 μm and about 15 μm, such as about 5 μm.

After the second passivation layer 109 has been formed, an opening may be made through the second passivation layer 109 by removing portions of the second passivation layer 109 to expose at least a portion of the underlying contact pad 105. The opening allows for contact between the contact pad 105 and the PPI 111 (discussed further below). The opening may be formed using a suitable photolithographic mask and etching process, although any suitable process to expose portions of the contact pad 105 may be used.

After the contact pad 105 has been exposed, the PPI 111 may be formed to extend along the second passivation layer 109. The PPI 111 may be utilized as a redistribution layer to allow the UBM 115 that is electrically connected to the contact pad 105 to be placed in any desired location on the semiconductor die 100, instead of limiting the location of the UBM 115 to the region directly over the contact pad 105. In an embodiment the PPI 111 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the PPI 111 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width along the substrate 101 of between about 5 μm and about 300 μm, such as about 15 μm. However, while the material and methods discussed are suitable to form the conductive material, these materials are merely exemplary. Any other suitable materials, such as AlCu or Au, and any other suitable processes of formation, such as CVD or PVD, may alternatively be used to form the PPI 111.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the PPI 111 has been formed, the third passivation layer 113 may be formed to protect the PPI 111 and the other underlying structures. The third passivation layer 113, similar to the second passivation layer 109, may be formed from a polymer such as polyimide, or may alternatively be formed of a similar material as the first passivation layer 107 (e.g., silicon oxides, silicon nitrides, low-k dielectrics, extremely low-k dielectrics, combinations of these, and the like). The third passivation layer 113 may be formed to have a thickness of between about 2 μm and about 15 μm, such as about 5 μm.

After the third passivation layer 113 has been formed, a PPI opening 108 may be made through the third passivation layer 113 by removing portions of the third passivation layer 113 to expose at least a portion of the underlying PPI 111. The PPI opening 108 allows for contact between the UBM 115 and the PPI 111. The PPI opening 108 may be formed using a suitable photolithographic mask and etching process, although any suitable process to expose portions of the PPI 111 may alternatively be used.

Once the PPI 111 has been exposed through the third passivation layer 113, the UBM 115 may be formed in electrical contact with the PPI 111. The UBM 115 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 115. Any suitable materials or layers of material that may be used for the UBM 115 are fully intended to be included within the scope of the current application.

The UBM 115 may be created by forming each layer over the third passivation layer 113 and along the interior of the PPI opening 108 through the third passivation layer 113. The forming of each layer may be performed using a plating process, such as electrochemical plating, although other processes of formation, such as sputtering, evaporation, or PECVD process, may alternatively be used depending upon the desired materials. The UBM 115 may be formed to have a thickness of between about 0.7 μm and about 10 μm, such as about 5 μm. Once the desired layers have been formed, portions of the layers may then be removed through a suitable photolithographic masking and etching process to remove the undesired material and to leave the UBM 115 in a desired shape, such as a circular, octagonal, square, or rectangular shape, although any desired shape may alternatively be formed.

The contact bump 117 may comprise a material such as tin, or other suitable materials, such as silver, lead-free tin, or copper. In an embodiment in which the contact bump 117 is a tin solder bump, the contact bump 117 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

Figure 2:
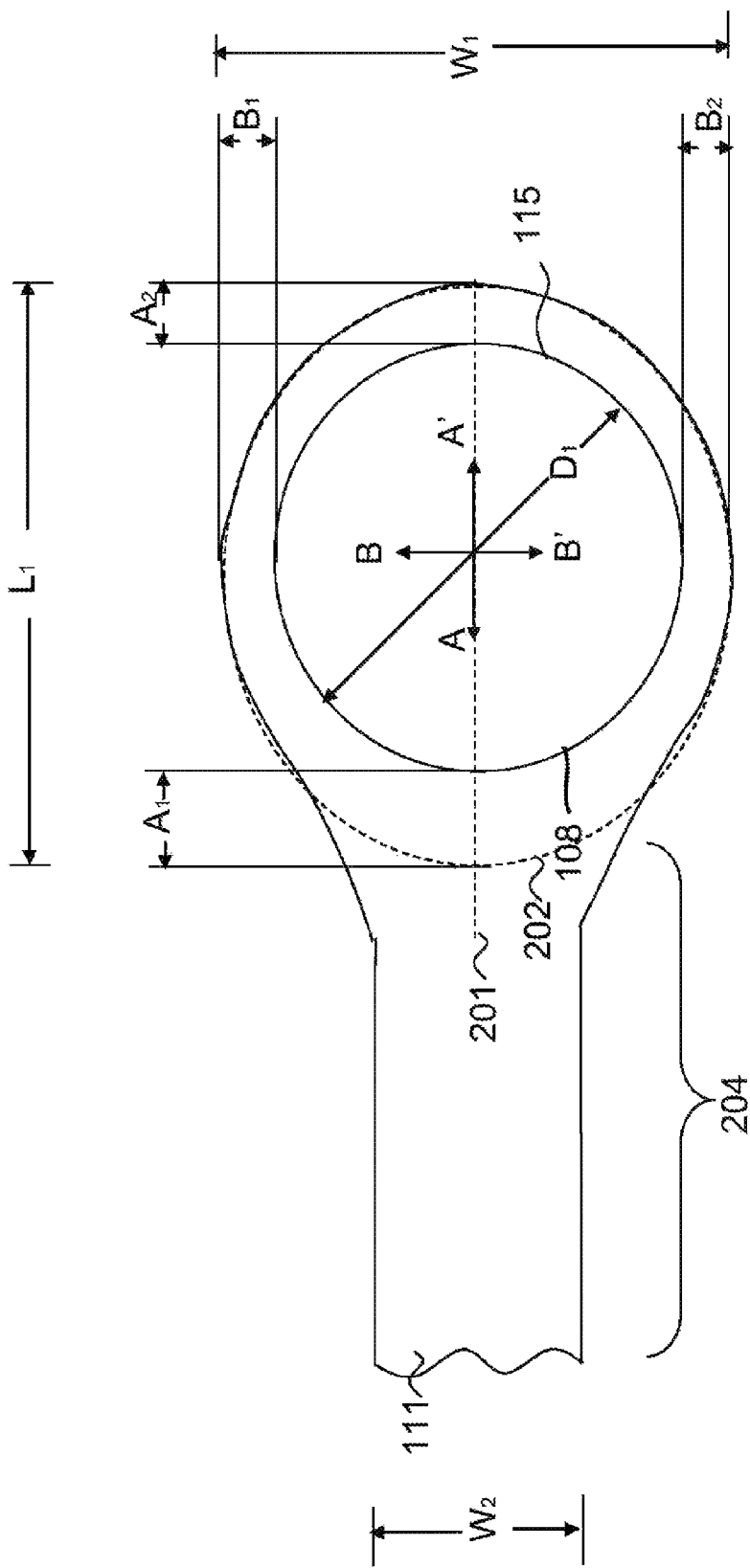
FIG. 2 illustrates a top-down view of the post-passivation interconnect and underbump metallization in accordance with an embodiment.

FIG. 2 illustrates a top view of the UBM 115 overlying the PPI 111 and the PPI openings 108 along line A-A' (in FIG. 1), with the contact bump 117, the third passivation layer 113, and the layers underlying the PPI 111 removed from FIG. 2 for clarity. Additionally in this view, the UBM 115 within the PPI opening 108 and the PPI opening 108 itself share the same boundary. As can be seen in this top-down view, the PPI opening 108 and the UBM 115 within the PPI openings 108 may have a first diameter $D_1$ of between about 60 µm and about 500 µm, such as about 250 µm. The PPI 111 may have an interconnect region 204 and a first region 202, e.g., a landing pad, underlying the UBM 115 that has a larger dimension in each direction than the PPI opening 108 and effectively, from this top-down point of view, surrounds the PPI opening 108 and the UBM 115 within the PPI opening 108. In an embodiment the PPI 111 may have a first length $L_1$ in one direction (e.g., parallel to line A-A') that is larger than a first width $W_1$ in another direction (e.g., parallel to line B-B'). By having the first length $L_1$ larger than the first width $W_1$, the PPI 111 may additionally have a longitudinal axis, represented in FIG. 2 by the dashed line 201. Additionally, the interconnect region 204 may have a second width $W_2$ less than the first width $W_1$, such as between about 60 µm and about 550 µm, such as about 300 µm.

As an example only, in the embodiment shown in FIG. 2, the first length $L_1$ of the PPI 111 may extend beyond the PPI opening 108 a first distance $A_1$, which may be between about 0.5 µm and about 100 µm, such as about 50 µm. In an opposite direction the first length $L_1$ of the PPI 111 may extend beyond the PPI opening 108 a second distance $A_2$, which may be between about 0.5 µm and about 100 µm, such as about 50 µm. As such, the first length $L_1$ of the PPI 111 may be equal to the first diameter $D_1$ of the PPI opening 108 plus the first distance $A_1$ and the second distance $A_2$.

Additionally, the first width $W_1$ of the first region 202 of the PPI 111 may extend a third distance $B_1$, which may be between about 0.5 µm and about 50 µm, such as about 5 µm. In an opposite direction perpendicular to the longitudinal axis 201, the PPI 111 may extend a fourth distance $B_2$, which may be between about 0.5 µm and about 50 µm, such as about 5 µm. As such, the first width $W_1$ of the first region 202 of the PPI 111 may equal the first diameter $D_1$ of the PPI opening 108 plus the third distance $B_1$ and the fourth distance $B_2$.

In an embodiment the first distance $A_1$ and the second distance $A_2$ may be equal to each other, although alternatively they may not be equal to each other. Similarly, the third distance $B_1$ may be the same as the fourth distance $B_2$, although alternatively they may be different distances as well. However, in an embodiment in which the first region 202 of the PPI 111 has an elongated shape and the PPI opening 108 is circular with the first diameter $D_1$, the total of the sum of the first distance $A_1$ and the second distance $A_2$ is greater than the sum of the third distance $B_1$ and the fourth distance $B_2$. As such, the first length $L_1$ of the first region 202 of the PPI 111 may be the sum of the first diameter $D_1$ plus the first distance $A_1$ and the second distance $A_2$, while the first width $W_1$ of the first region 202 of the PPI 111 beneath the UBM 115 may be the sum of the first diameter $D_1$ plus the third distance $B_1$ and the fourth distance $B_2$.

By expanding the size of the PPI 111 such that the PPI 111 has larger dimensions that the PPI opening 108 in the first region 202, and even beyond the UBM 115, the PPI 111 can effectively shield the underlying layers, such as the metallization layers 103 (see FIG. 1), that have a combination of metals and extremely low-k dielectric layers from the peeling stresses that can occur during thermal processing. In particular, the PPI 111 can effectively shield the underlying layers from stresses generated by thermal expansion mismatches between the layers. As such, delamination of the layers is less likely to occur, and the overall yield of the manufacturing processes may be increased. Additionally, by expanding the PPI 111 in the first region 202, the remainder of the PPI 111 does not also have to be expanded, thereby allowing for an increase in the metal density of the PPI 111 layer than would otherwise be obtained if the entire PPI 111 were enlarged.

Figure 3:
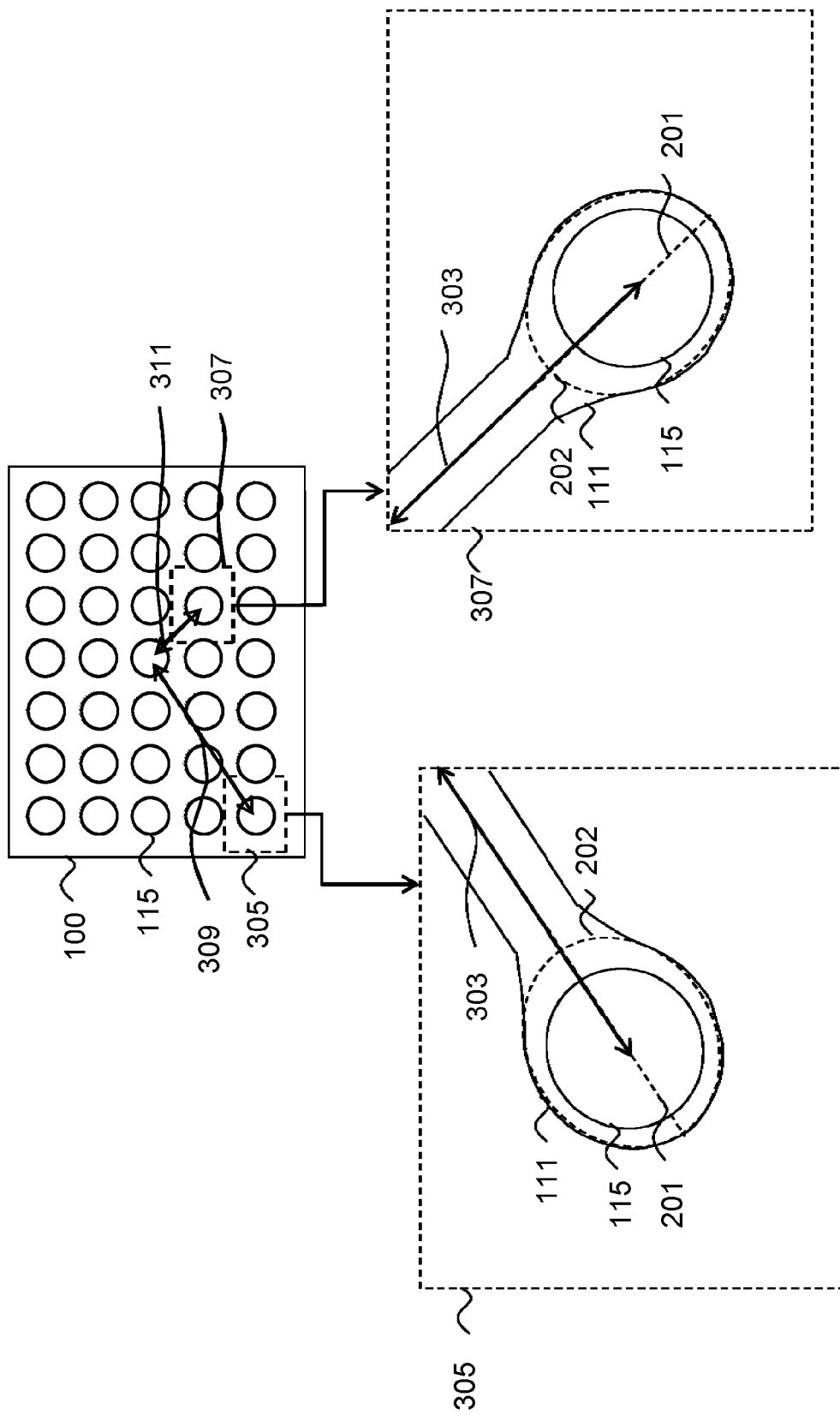
FIG. 3 illustrates a top-down view of an alignment of the post-passivation interconnect in accordance with an embodiment.

FIG. 3 illustrates a top down view of the semiconductor die 100 with a plurality of UBMs 115 located thereon (the top down view illustrates only the UBMs 115 located on the die while the first example 305 and second example 307 illustrate both the UBMs 115 as well as the PPIs 111). As illustrated, in an embodiment the longitudinal axis 201 of the PPI 111 beneath the UBMs 115 may be aligned in a direction of coefficient of thermal expansion mismatch (represented in FIG. 3 by line 303). As an example only, on the semiconductor die 100 the direction of coefficient of thermal expansion mismatch 303 radiates outward from the center of the semiconductor die 100. As such, for each one of the UBMs 115 illustrated in FIG. 3, the direction of coefficient of thermal expansion mismatch 303 may be determined by drawing a line (e.g., first line 309 and second liner 311 in FIG. 3) from the center of the semiconductor die 100 to the center of the individual UBMs 115. Once the direction of coefficient of thermal expansion mismatch 303 for each of the individual UBMs 115 has been determined, the longitudinal axis 201 of each of the PPIs 111 underlying each of the individual UBMs 115 may be aligned along the same lines.

Two examples of this are illustrated in FIG. 3, with a first example being represented by the dashed box 305 and a second example being represented by the dashed box 307. In the first example the UBM 115 is located along an outer edge of the semiconductor die 100, and the direction of coefficient of thermal expansion mismatch 303 may be determined by extending a first line 309 from the center of the semiconductor die 100 to a center of the UBM 115 within the dashed box 305. Once the direction of coefficient of thermal expansion mismatch 303 has been determined for the UBM 115 within the dashed box 307, the longitudinal axis 201 of the PPI 111 may be aligned with the direction of coefficient of thermal expansion mismatch 303, thereby helping to shield the underlying layers from stresses caused by differences in the coefficients of thermal expansion.

In the second example, similar to the first example, the direction of coefficient of thermal expansion mismatch 303 may be determined by extending a second line 311 from the center of the semiconductor die 100 to a center of the UBM 115 within the dashed box 307. Once the direction of coefficient of thermal expansion mismatch 303 has been determined for the UBM 115 within the dashed box 307, the longitudinal axis 201 of the underlying PPI 111 may be aligned with the direction of coefficient of thermal expansion mismatch 303, thereby also helping to shield the underlying layers from stresses caused by differences in the coefficients of thermal expansion.

However, as one of ordinary skill will recognize, the above described method of determining the direction of coefficient of thermal expansion mismatch 303 is not the only method that may be used. Alternative methods, such as experimentally measuring the actual direction of coefficient of thermal expansion mismatch 303 may alternatively be utilized. Additionally, the first region 202 may be rotated relative to the remainder of the PPI 111 in order to have the longitudinal axis 201 of the first region 202 aligned with the direction of coefficient of thermal expansion mismatch 303. These methods and any other suitable method may alternatively be used and are fully intended to be included within the scope of the present embodiments.

Figure 4:
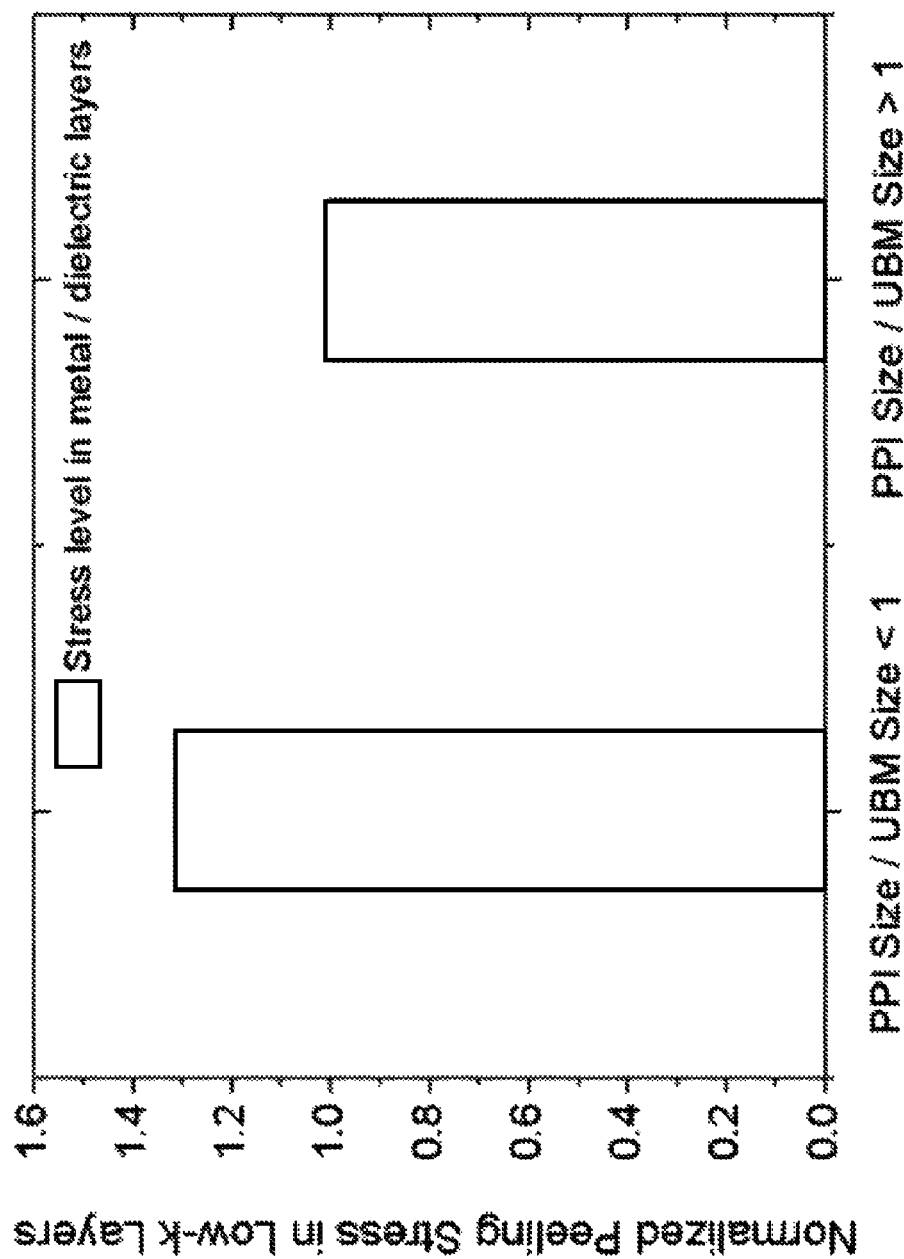
FIG. 4 illustrates modeling results of the post-passivation interconnect and underbump metallization in accordance with an embodiment.

FIG. 4 illustrates modeling results that help to illustrate the benefits of the embodiments. As can be shown, the relative stress level in the underlying metallization layers may be reduced by having the size of the PPI 111 be larger than the size of the overlying UBM 115. As such, the PPI 111 is effectively shielding the underlying metallization layers 103 from the stresses resulting from the coefficient of thermal expansion mismatch. As such, by reducing the stress level, the possibility of delamination can also be reduced.

Figure 5:
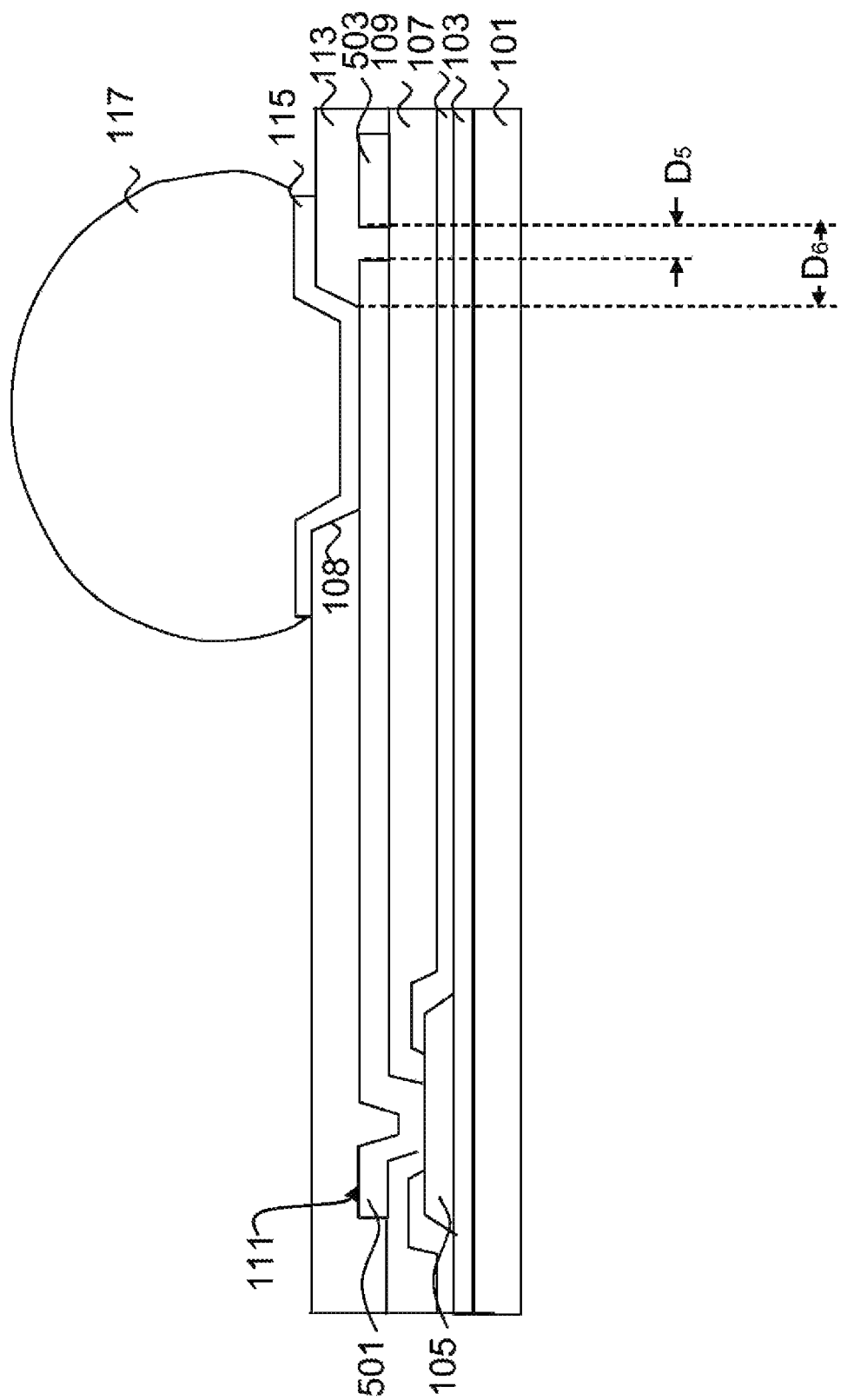
FIG. 5 illustrates a cross-sectional view of a discontinuous post-passivation interconnect and underbump metallization in accordance with an embodiment.

FIG. 5 illustrates another embodiment in which the PPI 111 may be formed as a discontinuous layer with a primary section 501 and a first periphery section 503. In the embodiment illustrated in FIG. 5, the primary section 501 of the PPI 111 may extend from the contact pad 105 to underneath the UBM 115, but may not fully extend beyond the UBM 115 on the other side. However, the first periphery section 503 of the PPI 111 may be formed in order to provide the shielding for the underlying layers by being laterally removed from the PPI opening 108 and by having a portion located beneath the UBM 115 and a portion extending beyond the UBM 115. In an embodiment, the first periphery section 503 of the PPI 111 may be separated from the primary section 501 a fifth distance $D_5$ of between about 0.5 μm and about 100 μm, such as about 10 μm, and may be laterally removed from the PPI opening 108 a sixth distance $D_6$ of between about 1 μm and about 300 μm, such as about 5 μm.

Figure 6A:
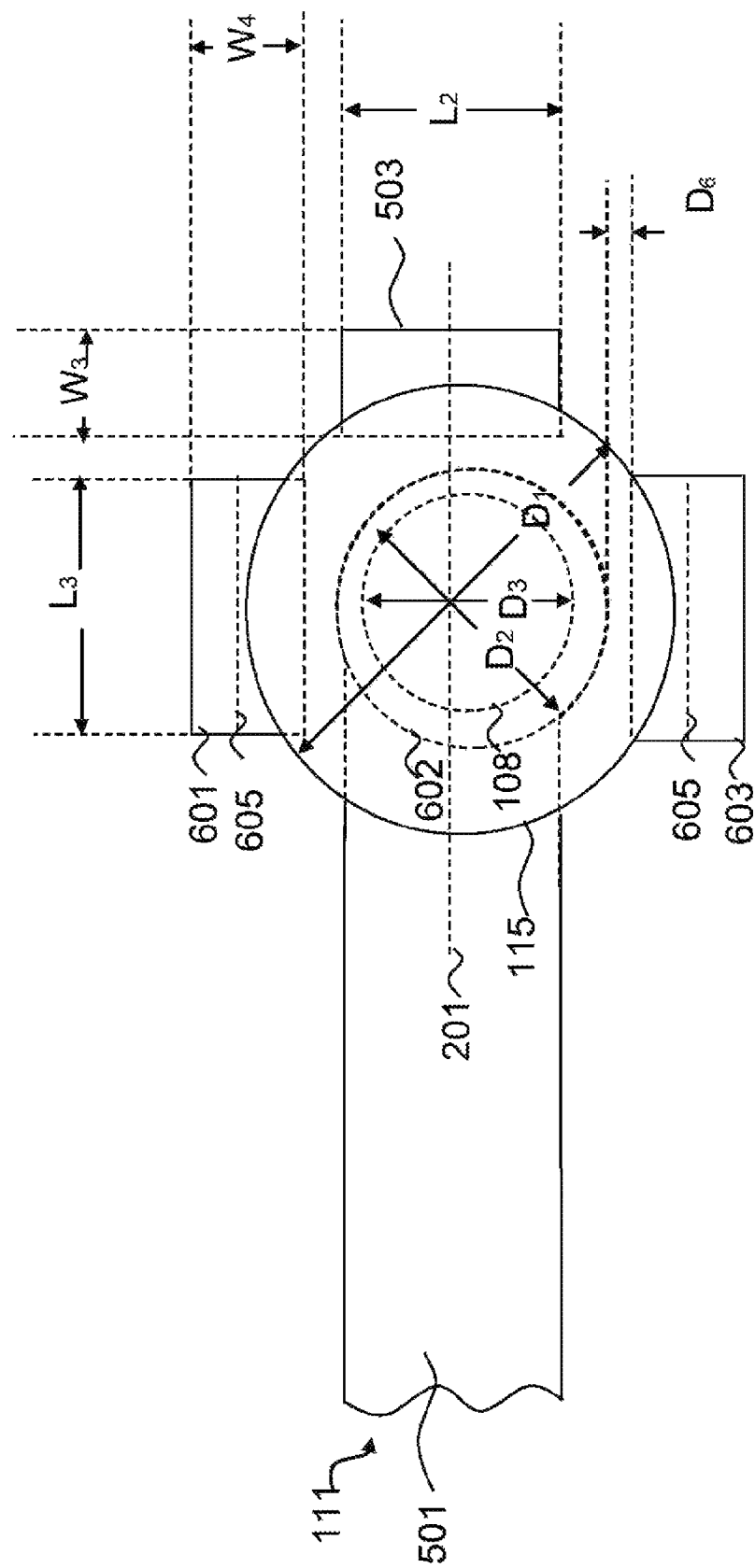

FIG. 6A illustrates a top-down view of the embodiment illustrated in FIG. 5 in which the PPI 111, the PPI opening 108 and the entire UBM 115 (including those portions of the UBM 115 that are located outside of the PPI openings 108) are illustrated. In this embodiment, the primary section 501 may have a second region 602 underlying the UBM 115 which may have a second diameter $D_2$ that is smaller than the first diameter $D_1$ of the UBM 115. For example, the second region 602 may have a second diameter $D_2$ that is between about 15 μm and about 450 μm, such as about 250 μm. Additionally, the PPI opening 108 in this embodiment may have a third diameter $D_3$ of between about 5 μm and about 400 μm, such as about 50 μm. The second region 602 may be a continuous conductive material, or else may have be patterned with dielectric material to form a discontinuous conductive material.

The first periphery section 503 is illustrated in FIG. 6A as a rectangle with a third width $W_3$ of between about 3 μm and about 300 μm, such as about 20 μm, and a second length $L_2$ of between about 3 μm and about 300 μm, such as about 20 μm. Additionally, FIG. 6A also illustrates a second periphery section 601 and a third periphery section 603 with longitudinal axes 605 parallel with the longitudinal axis 201 of the primary section 501. In an embodiment, the second periphery section 601 and the third periphery section 603 may be formed to have a fourth width $W_4$ of between about 3 μm and about 300 μm, such as about 20 μm, and a third length $L_3$ of between about 3 μm and about 300 μm, such as about 20 μm. Furthermore, the second periphery section 601 and the third periphery section 603 may be separated from the primary section 501 by a sixth distance $D_6$ of between about 0.5 μm and about 100 μm, such as about 10 μm.

By utilizing a discontinuous PPI 111 with a primary section 501 and periphery sections such as the first periphery section 503, the second periphery section 601 and the third periphery section 603, the design options for the PPI 111 may be expanded while still maintaining the benefits of the PPI 111 shielding the underlying layers. As such, the design options may be expanded, thereby making the overall design simpler for the designer.

Figure 6B:
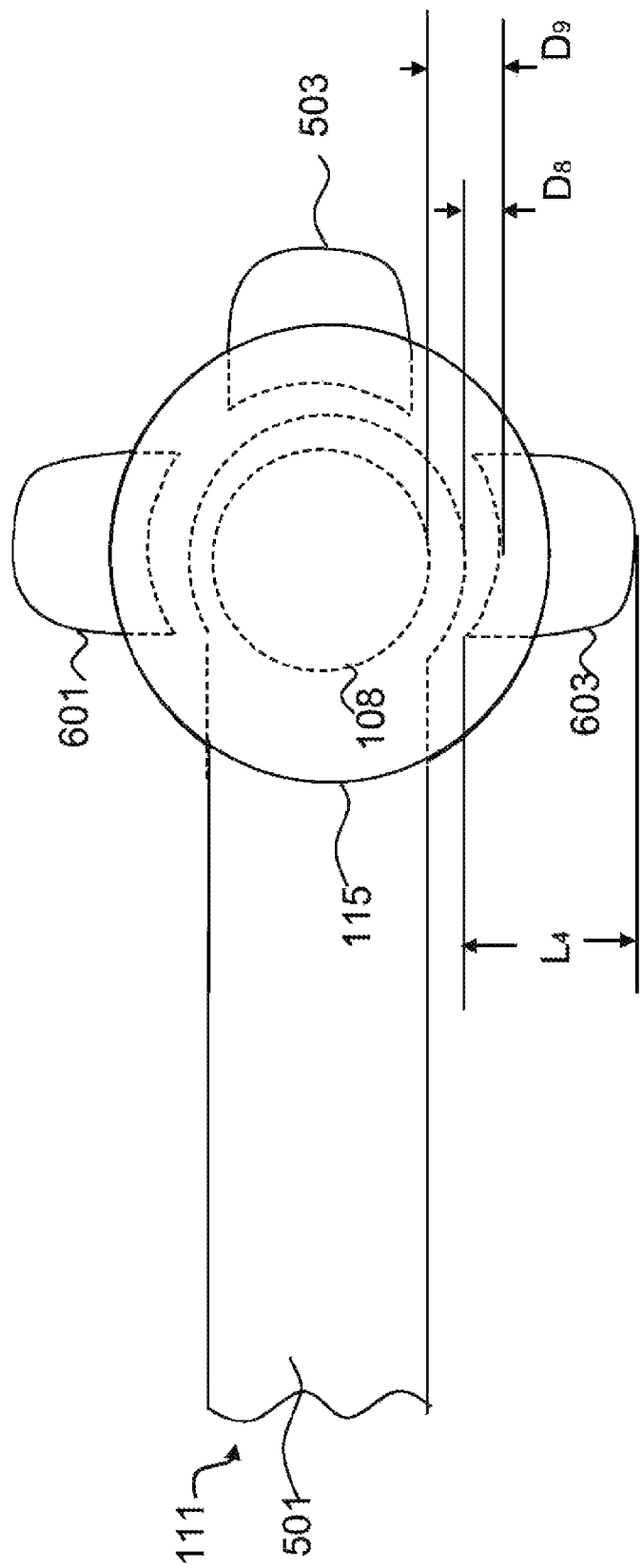

FIG. 6B illustrates yet another embodiment in which the first periphery section 503, the second periphery section 601 and the third periphery section 603 are designed not as rectangles (as in FIG. 6A above), but in a crescent-type shape. In this embodiment the primary section 501 may retain its circular shape with the second diameter $D_2$ ending without extending beyond the UBM 115. However, the first periphery section 503, the second periphery section 601 and the third periphery section 603 may have an inner edge that generally conforms to the outer shape of the primary section 501. Additionally, the outer edge of the first periphery section 503, the second periphery section 601 and the third periphery section 603 may extend beyond the outer limits of the UBM 115. In an embodiment, the first periphery section 503, the second periphery section 601 and the third periphery section 603 may be separated from the primary section 501 by an eighth distance $D_8$, and may extend a fourth length $L_4$ of between about 0.5 μm and about 100 μm, such as about 10 μm. Additionally, the periphery sections, such as the third periphery section 603 may be laterally separated from the PPI opening 108 an ninth distance $D_9$ of between about 1 μm and about 300 μm, such as about 5 μm.

FIG. 6C illustrates yet another embodiment in which the first periphery section 503, the second periphery section 601, and the third periphery section 603 are shaped as ovals, and may be formed a tenth distance $D_{10}$ away from the primary section 501 of between about 1 μm and about 300 μm, such as about 5 μm, while the periphery sections, such as the third periphery section 603 may be laterally separated from the PPI opening 108 an eleventh distance $D_{11}$ of between about 2 μm and about 500 μm, such as about 8 μm. In this embodiment, the first periphery section 503, the second periphery section 601, and the third periphery section 603 may have a fifth length $L_5$ of between about 3 μm and about 300 μm, such as about 20 μm, and a fifth width $W_5$ of between about 3 μm and about 300 μm, such as about 20 μm. However, each of the first periphery section 503, the second periphery section 601, and the third periphery section 603 may alternatively have different dimensions.

However, as one of ordinary skill in the art will recognize, the precise shape of the primary section 501, the first periphery section 503, the second periphery section 601, and the third periphery section 603 are not intended to be limited to the rectangular, crescent, and oval shapes described in FIGS. 6A-6C. Rather, any suitable shape, such as a trapezoid shape, a circular shape, or a diamond shape may be alternatively utilized. These and any other suitable shapes are fully intended to be included within the scope of the present embodiments.

Similar to the first embodiment, the presence of the PPI 111 with the primary section 501, the first periphery section 503, the second periphery section 601, and the third periphery section 603 helps to shield the underlying layers from stresses that can build because of the mismatch in the different materials' coefficient of thermal expansions. As such, by shielding the underlying layers from the stresses, the chance of delamination may be reduced, and the overall yield for the manufacturing process may be increased.

In accordance with an embodiment, a semiconductor device comprising a post-passivation interconnect over a substrate is provided. The post-passivation interconnect comprises a landing pad region with a first length and a first width and an interconnect region with a second width less than the first width. An underbump metallization is over the post-passivation interconnect, the underbump metallization having an interface in contact with the landing pad region, the interface having a second length that is less than the first width and the first length, the underbump metallization having a third length that is less than the first width and the first length.

In accordance with another embodiment, a semiconductor device comprising a contact pad on a substrate is provided. A redistribution layer is in electrical contact with the contact pad, the redistribution layer comprising a landing pad for an underbump metallization, the landing pad having a first length and a first width. An underbump metallization is in physical contact with the landing pad, the underbump metallization having a second length greater than the first length and a second width greater than the first width. A first periphery region of conductive material underlies an outside edge of the underbump metallization and is laterally separated from the redistribution layer.

In accordance with yet another embodiment, a semiconductor device comprising a post-passivation interconnect structure over a substrate is provided. The post-passivation interconnect structure comprises a landing pad region with a first length, a first width smaller than the first length, and a longitudinal axis, and an interconnect region with a second width, the second width being smaller than the first width. A passivation layer is over the post-passivation interconnect structure and an opening is through the passivation layer to the landing pad region. An underbump metallization overlies and is in contact with the landing pad region, wherein the landing pad region extends beyond the opening in a first direction parallel with the longitudinal axis and also extends beyond the opening in a second direction perpendicular with the longitudinal axis.

Although the present embodiments and their advantages have been described in detail, it should be understood that various changes, substitutions and alterations can be made herein without departing from the spirit and scope of the embodiments as defined by the appended claims. For example, the precise shape of the first periphery section, the second periphery section, and the third periphery section may be changed, or the methodology for determining the direction of coefficient of thermal expansion mismatch may be changed.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a post-passivation interconnect over a substrate, wherein the post-passivation interconnect comprises:
      a landing pad region with a first length and a first width, wherein the landing pad region has an elongated shape; and
      an interconnect region with a second width less than the first width; and
   an underbump metallization over the post-passivation interconnect, the underbump metallization having an interface in contact with the landing pad region, the interface having a second length that is less than the first width and the first length, the underbump metallization having a third length that is less than the first width and the first length.

2. The semiconductor device of claim 1, wherein the landing pad comprises a continuous conductive material.

3. The semiconductor device of claim 1, wherein the first length is greater than the first width.

4. The semiconductor device of claim 3, wherein the landing pad has a longitudinal axis aligned with a center of the substrate.

5. The semiconductor device of claim 1, further comprising a passivation layer over the post-passivation interconnect, the underbump metallization extending through the passivation layer.

6. The semiconductor device of claim 1, wherein the landing pad extends an equal distance from the interface in two opposite directions, the two opposite directions both being aligned with a longitudinal axis of the landing pad.

7. The semiconductor device of claim 1, wherein the landing pad extends from the interface a first distance in a first direction parallel with a longitudinal axis of the landing pad and a second distance in a second direction aligned with the first direction, the second distance being different from the first distance, the first direction being different from the second direction.

8. The semiconductor device of claim 1, wherein the landing pad extends an equal distance from the interface in two opposite directions, the two opposite directions both being aligned with each other and being perpendicular with a longitudinal axis of the landing pad.

9. The semiconductor device of claim 1, wherein the landing pad extends from the interface a first distance in a first direction perpendicular with a longitudinal axis of the landing pad and a second distance in a second direction aligned with the first direction, the second distance being different from the first distance, the first direction being different from the second direction.

10. A semiconductor device comprising:
    a contact pad on a substrate;
    a redistribution layer in electrical contact with the contact pad, the redistribution layer comprising a landing pad, the landing pad having a first length and a first width;
    an underbump metallization in physical contact with the landing pad, the underbump metallization having a second length greater than the first length and a second width greater than the first width; and
    a first periphery region of conductive material underlying an outside edge of the underbump metallization and being laterally separated from the redistribution layer, wherein the first periphery region is electrically isolated from any external contacts.

11. The semiconductor device of claim 10, further comprising a passivation layer over a first layer, wherein the first periphery region of conductive material and the redistribution layer are located in the first layer.

12. The semiconductor device of claim 10, wherein the first periphery region is a rectangle.

13. The semiconductor device of claim 10, wherein the first periphery region is a crescent.

14. The semiconductor device of claim 10, wherein the first periphery region is an oval.

15. The semiconductor device of claim 10, further comprising a second periphery region underlying the outside edge of the underbump metallization and a third periphery region underlying the outside edge of the underbump metallization, the second periphery region being laterally separated from the third periphery region and the first periphery region.

16. The semiconductor device of claim 10, wherein the landing pad is a continuous conductive material.

17. A semiconductor device comprising:
   a post-passivation interconnect structure over a substrate, the post-passivation interconnect structure comprising:
      a landing pad region with an oval shape, a first length, a first width smaller than the first length, and a longitudinal axis; and
      an interconnect region with a second width, the second width being smaller than the first width;
   a passivation layer over the post-passivation interconnect structure;
   an opening through the passivation layer to the landing pad region;
   an underbump metallization overlying and in contact with the landing pad region through the opening, wherein the landing pad region extends beyond the opening in a first direction parallel with the longitudinal axis and also extends beyond the opening in a second direction perpendicular with the longitudinal axis.

18. The semiconductor device of claim 17, wherein the post-passivation interconnect structure is continuous.

19. The semiconductor device of claim 17, wherein the landing pad has a longitudinal axis aligned with a center of the substrate.

20. The semiconductor device of claim 17, wherein a center of the underbump metallization is offset from a center of the landing pad.

* * * * *